(12) United States Patent
Liang

(10) Patent No.: US 9,093,791 B2
(45) Date of Patent: Jul. 28, 2015

(54) COMMUNICATIONS CONNECTORS HAVING CROSSTALK STAGES THAT ARE IMPLEMENTED USING A PLURALITY OF DISCRETE, TIME-DELAYED CAPACITIVE AND/OR INDUCTIVE COMPONENTS THAT MAY PROVIDE ENHANCED INSERTION LOSS AND/OR RETURN LOSS PERFORMANCE

(71) Applicant: CommScope, Inc. of North Carolina, Hickory, NC (US)

(72) Inventor: Hongwei Liang, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 14/057,224

(22) Filed: Oct. 18, 2013

(65) Prior Publication Data

US 2014/0127943 A1   May 8, 2014

Related U.S. Application Data

(60) Provisional application No. 61/722,314, filed on Nov. 5, 2012.

(51) Int. Cl.
| | | |
|---|---|---|
| H01R 13/66 | (2006.01) | |
| H01R 24/00 | (2011.01) | |
| H01R 13/6464 | (2011.01) | |
| H01R 13/658 | (2011.01) | |
| H01R 12/50 | (2011.01) | |
| G02B 6/42 | (2006.01) | |
| H05K 9/00 | (2006.01) | |
| H01R 13/502 | (2006.01) | |

(52) U.S. Cl.
CPC .......... *H01R 13/6464* (2013.01); *G02B 6/4201* (2013.01); *H01R 13/5025* (2013.01); *H01R 13/658* (2013.01); *H01R 13/65802* (2013.01); *H01R 13/6658* (2013.01); *H01R 23/005* (2013.01); *H01R 23/025* (2013.01); *H01R 23/6873* (2013.01); *H05K 9/0058* (2013.01)

(58) Field of Classification Search
CPC . H01R 13/025; H01R 23/6616; H01R 23/005
USPC ............. 439/620.09, 620.11, 620.21, 620.23, 439/941
See application file for complete search history.

(56) References Cited

U.S. PATENT DOCUMENTS

| | | |
|---|---|---|
| 5,997,358 A | 12/1999 | Adriaenssens et al. |
| 8,197,286 B2 | 6/2012 | Larsen et al. |
| 2010/0317230 A1* | 12/2010 | Larsen et al. ............ 439/620.22 |

* cited by examiner

*Primary Examiner* — Abdullah Riyami
*Assistant Examiner* — Justin Kratt
(74) *Attorney, Agent, or Firm* — Myers Bigel Sibley & Sajovec, P.A.

(57) ABSTRACT

Communications connectors include a plurality of "discrete" elements to implement the capacitive and/or inductive components of offending and/or compensatory crosstalk stages. By sub-dividing the crosstalk stages into a plurality of time-delayed discrete elements improved return loss and insertion loss may be achieved for very high frequency signals, without having a substantial impact on the crosstalk performance of the connector.

20 Claims, 13 Drawing Sheets

COMMUNICATIONS CONNECTORS HAVING CROSSTALK STAGES THAT ARE IMPLEMENTED USING A PLURALITY OF DISCRETE, TIME-DELAYED CAPACITIVE AND/OR INDUCTIVE COMPONENTS THAT MAY PROVIDE ENHANCED INSERTION LOSS AND/OR RETURN LOSS PERFORMANCE

CROSS-REFERENCE TO RELATED APPLICATION

The present application claims priority under 35 U.S.C. §119 to U.S. Provisional Application Ser. No. 61/722,314, filed Nov. 5, 2012, the entire content of which is incorporated herein by reference as if set forth in its entirety.

FIELD OF THE INVENTION

The present invention relates generally to communications connectors and, more particularly, to communications connectors that include elements that introduce offending and/or compensating crosstalk.

BACKGROUND

Computers, fax machines, printers and other electronic devices are routinely connected by communications cables to network equipment and/or to external networks such as the Internet. FIG. 1 illustrates the manner in which a computer 10 may be connected to network equipment 20 using conventional communications plug/jack connections. As shown in FIG. 1, the computer 10 is connected by a patch cord assembly 11 to a communications jack 30 that is mounted in a wall plate 19. The patch cord assembly 11 comprises a communications cable 12 that contains a plurality of individual conductors (e.g., insulated copper wires) and two communications plugs 13, 14 that are attached to the respective ends of the cable 12. The communications plug 13 is inserted into a communications jack (not pictured in FIG. 1) that is provided in the computer 10, and the communications plug 14 is inserted into a plug aperture 32 in the front side of the communications jack 30. The plug contacts (which are commonly referred to as "blades") of communications plug 14 (which are exposed through the slots 15 on the top and front surfaces of communications plug 14) mate with respective contacts (not visible in FIG. 1) of the communications jack 30 when the communications plug 14 is inserted into the plug aperture 32. The blades of communications plug 13 similarly mate with respective contacts of the communications jack (not pictured in FIG. 1) that is provided in the computer 10.

The communications jack 30 includes a back-end connection assembly 50 that receives and holds conductors from a cable 60. As shown in FIG. 1, each conductor of cable 60 is individually pressed into a respective one of a plurality of slots provided in the back-end connection assembly 50 to establish mechanical and electrical connection between each conductor of cable 60 and the communications jack 30. The other end of each conductor in cable 60 may be connected to, for example, the network equipment 20. The wall plate 19 is typically mounted on a wall (not shown) of a room or office of, for example, an office building, and the cable 60 typically runs through conduits in the walls and/or ceilings of the building to a room in which the network equipment 20 is located. The patch cord assembly 11, the communications jack 30 and the cable 60 provide a plurality of signal transmission paths over which information signals may be communicated between the computer 10 and the network equipment 20. It will be appreciated that typically one or more patch panels or switches, along with additional communications cabling, would be included in the electrical path between the cable 60 and the network equipment 20. However, for ease of description, these additional elements have been omitted from FIG. 1 and the cable 60 is instead shown as being directly connected to the network equipment 20.

In many electrical communications systems that are used to interconnect computers, network equipment, printers and the like, the information signals are transmitted between devices over a pair of conductors (hereinafter a "differential pair" or simply a "pair") rather than over a single conductor. The signals transmitted on each conductor of the differential pair have equal magnitudes, but opposite phases, and the information signal is embedded as the voltage difference between the signals carried on the two conductors of the pair. When signals are transmitted over a conductor (e.g., an insulated copper wire) in a communications cable, electrical noise from external sources such as lightning, electronic equipment, radio stations, etc. may be picked up by the conductor. These noise signals may interfere with any information signal that is being transmitted over the conductor. When the information signal is transmitted over a differential pair of conductors, each conductor in the differential pair often picks up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair; thus, the noise signal is cancelled out by the subtraction process.

The cables and connectors in many, if not most, high speed communications systems include eight conductors that are arranged as four differential pairs. Channels are formed by cascading plugs, jacks and cable segments to provide connectivity between two end devices. In these channels, when a plug mates with a jack, the proximities and routings of the conductors and contacting structures within the jack and/or plug can produce capacitive and/or inductive couplings. Likewise, additional capacitive and/or inductive coupling may occur between the four differential pairs that are included within each cable. These capacitive and inductive couplings in the connectors and cabling give rise to another type of noise that is called "crosstalk."

"Crosstalk" in a communication system refers to unwanted signal energy that is induced onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal on the victim differential pair.

A variety of techniques may be used to reduce crosstalk in communications systems such as, for example, tightly twisting the paired conductors in a cable, whereby different pairs are twisted at different rates that are not harmonically related, so that each conductor in the cable picks up approximately equal amounts of signal energy from the two conductors of each of the other differential pairs included in the cable. If this condition can be maintained, then the crosstalk noise may be significantly reduced, as the conductors of each differential pair carry equal magnitude, but opposite phase signals such that the crosstalk added by the two conductors of a differential pair onto the other conductors in the cable tends to cancel out.

While such twisting of the conductors and/or various other known techniques may substantially reduce crosstalk in cables, most communications systems include both cables and communications connectors (i.e., jacks, plugs, connecting blocks, etc.) that interconnect the cables and/or connect the cables to computer hardware. Unfortunately, the connector configurations that were adopted years ago generally did not maintain the conductors of each differential pair a uniform distance from the conductors of the other differential pairs in the connector hardware. Moreover, in order to maintain backward compatibility with connector hardware that is already installed, the connector configurations have, for the most part, not been changed. As such, in each connector along a channel, the conductors of each differential pair tend to induce unequal amounts of crosstalk on each of the other conductor pairs. As a result, many current connector designs generally introduce some amount of NEXT and FEXT crosstalk.

Pursuant to certain industry standards (e.g., the TIA/EIA-568-B.2-1 standard approved Jun. 20, 2002 by the Telecommunications Industry Association), each jack, plug and cable segment in a communications system may include a total of eight conductors 1-8 that comprise four differential pairs. The industry standards specify that, in at least the connection region where the contacts (blades) of a modular plug mate with the contacts of the modular jack (referred to herein as the "plug jack mating region"), the eight conductors are aligned in a row, with the four differential pairs specified as depicted in FIG. 2. As known to those of skill in the art, under the TIA/EIA 568 type B configuration, conductors 4 and 5 in FIG. 2 comprise pair 1, conductors 1 and 2 comprise pair 2, conductors 3 and 6 comprise pair 3, and conductors 7 and 8 comprise pair 4.

As shown in FIG. 2, in the plug-jack mating region, the conductors of the differential pairs are not equidistant from the conductors of the other differential pairs. By way of example, conductors 1 and 2 of pair 2 are different distances from conductor 3 of pair 3. Consequently, differential capacitive and/or inductive coupling occurs between the conductors of pairs 2 and 3 that generate both NEXT and FEXT. Similar differential coupling occurs with respect to the other differential pairs in the modular plug and the modular jack. This differential coupling typically occurs in the blades of the modular plugs and in at least a portion of the contacts of the modular jack.

As the operating frequencies of communications systems increased, crosstalk in the plug and jack connectors became a more significant problem. To address this problem, communications jacks were developed that included compensating crosstalk circuits that introduced compensating crosstalk that was used to cancel much of the "offending" crosstalk that was being introduced in plug and the plug-jack mating region. In particular, in order to cancel the "offending" crosstalk that is generated in a plug-jack connector because a first conductor of a first differential pair inductively and/or capacitively couples more heavily with a first of the two conductors of a second differential pair than does the second conductor of the first differential pair, jacks were designed so that the second conductor of the first differential pair would capacitively and/or inductively couple with the first of the two conductors of the second differential pair later in the jack to provide a "compensating" crosstalk signal. As the first and second conductors of the differential pair carry equal magnitude, but opposite phase signals, so long as the magnitude of the "compensating" crosstalk signal that is induced in such a fashion is equal to the magnitude of the "offending" crosstalk signal, then the compensating crosstalk signal that is introduced later in the jack may substantially cancel out the offending crosstalk signal.

FIG. 3 is a schematic diagram of a plug-jack connector 60 (i.e., an RJ-45 communications plug 70 that is mated with an RJ-45 communications jack 80) that illustrate how the above-described crosstalk compensation scheme may work. As shown by the arrow in FIG. 3 (which represents the time axis for a signal flowing from the plug 70 to the jack 80), crosstalk having a first polarity (here arbitrarily shown by the "+" sign as having a positive polarity) is induced from the conductor(s) of a first differential pair onto the conductor(s) of a second differential pair. By way of example, when a signal is transmitted on pair 3 of plug 70, in both the plug 70 and in the plug-jack mating region portion of the jack 80, the signal on conductor 3 of pair 3 will induce a larger amount of current onto conductor 4 of pair 1 than conductor 6 of pair 3 will induce onto conductor 4 of pair 1, thereby resulting in an "offending" crosstalk signal on pair 1. By arranging the conductive paths in a later part of the jack 80 to include a capacitor between, for example, conductors 3 and 5 and/or to have inductive coupling between conductors 3 and 5, it is possible to introduce one or more "compensating" crosstalk signals in the jack 80 that will at least partially cancel the offending crosstalk signal on pair 1. An alternative method for generating such a compensating crosstalk signal would be to design the jack 80 to provide capacitive and/or inductive coupling between conductors 4 and 6, as the signal carried by conductor 6 has a polarity that is opposite the signal carried by conductor 3.

While the simplified example of FIG. 3 discusses methods of providing compensating crosstalk that cancels out the differential crosstalk induced from conductor 3 to conductor 4 (i.e., part of the pair 3 to pair 1 crosstalk), it will be appreciated that the industry standardized connector configurations result in offending crosstalk between various of the differential pairs, and compensating crosstalk circuits are typically provided in the jack for reducing the offending crosstalk between more than one pair combination.

FIG. 4 is a schematic graph that illustrates the offending crosstalk signal and the compensating crosstalk signal that are discussed above with respect to FIG. 3 as a function of time. In the blades of the plug 70 and in the plug-jack mating region of the jack 80, the offending crosstalk signal that is discussed in the example above is the signal energy induced from conductor 3 onto conductor 4 minus the signal energy induced from conductor 6 onto conductor 4. This offending crosstalk is represented by vector $A_0$ in FIG. 4, where the length of the vector represents the magnitude of the crosstalk and the direction of the vector (up or down) represents the polarity (positive or negative) of the crosstalk. The offending crosstalk typically includes both a capacitive component that arises from, for example, capacitive coupling between adjacent plug blades and an inductive component that arises from magnetic field coupling along the current paths through adjacent plug blades. It will be appreciated that at least the inductive component of the offending crosstalk will typically be distributed over the time axis, as the inductive coupling typically starts at the point where the wires of the cable (e.g., conductors 3-6) are untwisted and continues through the blades of the plug 70 and into the jack contact region of the jack 80 (and perhaps even further into the jack 80). For ease of description, both this distributed inductive crosstalk and the capacitive crosstalk are together represented as a single crosstalk vector $A_0$ having a magnitude equal to the sum of the distributed crosstalk that is located at the weighted midpoint of the differential coupling region (referred to herein as a "lumped approximation").

As is further shown in FIG. 4, the compensating crosstalk circuit in the jack 80 (e.g., a capacitor between conductors 4 and 6) induces a second crosstalk signal onto pair 1 which is represented by the vector $A_1$ in FIG. 4. As the crosstalk compensation circuit is located after the jackwire contacts (with respect to a signal travelling in the "forward" direction from the plug 70 to the jack 80), the compensating crosstalk vector $A_1$ is located farther to the right on the time axis. The compensating crosstalk vector $A_1$ has a polarity that is opposite to the polarity of the offending crosstalk vector $A_0$ as conductors 3 and 6 carry opposite phase signals. The crosstalk compensation scheme of FIG. 4 is referred to as a "single-stage" crosstalk compensation scheme as it includes a single crosstalk compensation stage.

The signals carried on the conductors are alternating current signals, and hence the phase of the signal changes with time. As the compensating crosstalk circuit is typically located quite close to the plug-jack mating region (e.g., less than an inch away), the time difference (delay) between the offending crosstalk region and the compensating crosstalk circuit is quite small, and hence the change in phase likewise is small for low frequency signals. As such, the compensating crosstalk signal can be designed to almost exactly cancel out the offending crosstalk with respect to low frequency signals (e.g., signals having a frequency less than 100 MHz).

However, for higher frequency signals, the phase change that occurs as a signal passes from the location of vector $A_0$ to the location of vector $A_1$ can become significant. Moreover, in order to meet the increasing throughput requirements of modern computer systems, there is an ever increasing demand for higher frequency connections. FIG. 5A is a vector diagram that illustrates how the phase of compensating crosstalk vector $A_1$ will change by an angle $\phi$ due to the time delay between vectors $A_0$ and $A_1$. As a result of this phase change $\phi$, vector $A_1$ is no longer offset from vector $A_0$ by 180°, but instead is offset by 180°–$\phi$. Consequently, compensating crosstalk vector $A_1$ will not completely cancel the offending crosstalk vector $A_0$. This can be seen graphically in FIG. 5B, which illustrates how the addition of vectors $A_0$ and $A_1$ still leaves a residual crosstalk vector. FIG. 5B also makes clear that the degree of cancellation decreases as $\phi$ gets larger. Thus, due to the increased phase change at higher frequencies, the above-described crosstalk compensation scheme cannot fully compensate for the offending crosstalk.

U.S. Pat. No. 5,997,358 to Adriaenssens et al. (hereinafter "the '358 patent") describes multi-stage crosstalk compensating schemes for plug-jack connectors that can be used to provide significantly improved crosstalk cancellation, particularly at higher frequencies. The entire contents of the '358 patent are hereby incorporated herein by reference as if set forth fully herein. Pursuant to the teachings of the '358 patent, two or more stages of compensating crosstalk are added, usually in the jack, that together reduce or substantially cancel the offending crosstalk at the frequencies of interest. The compensating crosstalk can be designed, for example, into the lead frame wires of the jack and/or into a printed wiring board that is electrically connected to the lead frame.

As discussed in the '358 patent, the magnitude and phase of the compensating crosstalk signal(s) induced by each stage are selected so that, when combined with the compensating crosstalk signals from the other stages, they provide a composite compensating crosstalk signal that substantially cancels the offending crosstalk signal over a frequency range of interest. In embodiments of these multi-stage compensation schemes, the first compensating crosstalk stage (which often includes both a capacitive component and an inductive component) has a polarity that is opposite the polarity of the offending crosstalk, while the second compensating crosstalk stage has a polarity that is the same as the polarity of the offending crosstalk.

FIG. 6A is a schematic graph of crosstalk versus time that illustrates the location of the offending and compensating crosstalk (depicted as lumped approximations) if the jack of FIG. 3 is modified to implement multi-stage compensation. As shown in FIG. 6A, the offending crosstalk signal that is induced in the plug 70 and in the plug-jack mating region of the jack 80 can be represented by the vector $B_0$ which has a magnitude equal to the sum of the distributed offending crosstalk and which is located at the weighted midpoint of the coupling region where the offending crosstalk is induced. As is further shown in FIG. 6A, the compensating crosstalk circuit in the jack 80 induces a second crosstalk signal which is represented by the vector $B_1$. As the crosstalk compensation circuit is located after the jackwire contacts (with respect to a signal travelling in the forward direction), the compensating crosstalk vector $B_1$ is located farther to the right on the time axis. The compensating crosstalk vector $B_1$ has a polarity that is opposite to the polarity of the offending crosstalk vector $B_0$. Moreover, the magnitude of the compensating crosstalk vector $B_1$ is larger than the magnitude of the offending crosstalk vector $B_0$. Finally, a second compensating crosstalk vector $B_2$ is provided that is located even farther to the right on the time axis. The compensating crosstalk signal which is represented by the vector $B_2$ has a polarity that is opposite the polarity of crosstalk vector $B_1$, and hence is the same as the polarity of the offending crosstalk vector $B_0$.

FIG. 6B is a vector summation diagram that illustrates how the multi-stage compensation crosstalk vectors $B_1$ and $B_2$ of FIG. 6A can, at least theoretically, completely cancel the offending crosstalk vector $B_0$ at a selected frequency. FIG. 6B takes the crosstalk vectors from FIG. 6A and plots them on a vector diagram that visually illustrates the magnitude and phase of each crosstalk vector. In FIG. 6B, the dotted line versions of vectors $B_1$ and $B_2$ are provided to show how the three vectors $B_0$, $B_1$ and $B_2$ may be designed to sum to approximately zero at a selected frequency. In particular, as shown in FIG. 6B, the first compensating crosstalk stage ($B_1$) significantly overcompensates the offending crosstalk. The second compensating crosstalk stage ($B_2$) is then used to bring the sum of the crosstalk back to the origin of the graph (indicating substantially complete cancellation at the selected frequency). The multi-stage (i.e., two or more) compensation schemes disclosed in the '358 patent thus can be more efficient at reducing crosstalk than single-stage crosstalk compensation schemes.

SUMMARY

Pursuant to embodiments of the present invention, communications plugs are provided that include a plug housing, first and second differential pairs of conductive paths within the plug housing, a first capacitor that is configured to inject crosstalk having a first polarity from the first differential pair to the second differential pair, and a second capacitor that is configured to inject crosstalk having the first polarity from the first differential pair to the second differential pair. The first and second capacitors are configured to inject crosstalk at respective first and second different points in time on a signal travelling on the second differential pair.

In some embodiments, the communications plug may further include a third capacitor that is configured to inject crosstalk having the first polarity from the first differential pair to the second differential pair. The third capacitor may be configured to inject crosstalk at a third point in time on the signal travelling on the second differential pair, where the third point in time is different than both the first and second points in time. In some embodiments, the communications plug may be mated with a communications jack to form a mated communications plug-jack connector. In such embodiments, the jack may include a third differential pair of conductive paths that is electrically connected to the first differential pair of conductive paths to form a first communications channel through the mated plug and jack, a fourth differential pair of conductive paths that is electrically connected to the second differential pair of conductive paths to form a second communications channel through the mated plug and jack, a third capacitor that is configured to inject crosstalk having a second polarity from the third differential pair to the fourth differential pair, the second polarity being opposite the first polarity, and a fourth capacitor that is configured to inject crosstalk having the second polarity from the third differential pair to the fourth differential pair, wherein the third and fourth capacitors are configured to inject crosstalk at respective third and fourth points in time onto a signal travelling on the fourth differential pair, wherein the third and fourth points in time are different.

Pursuant to further embodiments of the present invention, mated plug-jack connectors are provided that include a communications jack having a housing that includes a plug aperture and at least first and second differential pairs of communications paths and a communications plug that is received within the plug aperture of the jack. The plug has a third differential pair of communications paths that electrically connect to the first differential pair of communications paths of the jack and a fourth differential pair of communications paths that electrically connect to the second differential pair of communications paths of the jack. The plug includes an offending crosstalk stage that injects crosstalk having a first polarity between the third and fourth differential pairs of communications paths, the offending crosstalk stage including at least separate first and second capacitive components that are time-delayed with respect to each other. The jack includes a compensating crosstalk stage that injects crosstalk between the first and second differential pairs of communications paths that includes at least separate third and fourth capacitive components that are time-delayed with respect to each other.

In some embodiments, the crosstalk injected by the compensating crosstalk stage may have a second polarity that is opposite the first polarity. At least one of the offending crosstalk stage or the compensating crosstalk stage may include a total of at least three capacitive components that are time-delayed with respect to each other. The compensating crosstalk stage may include at least a first inductive component, a first capacitive component, and a third component that is time delayed with respect to both the first inductive component and the first capacitive component.

Pursuant to embodiments of the present invention, methods of reducing crosstalk in mated plug-jack connectors that include first through fourth differential pairs of conductive paths are provided. Pursuant to these methods, an offending crosstalk stage is provided in the plug-jack connector between the first differential pair and the second differential pair, where the offending crosstalk stage includes at least a first capacitor and a separate second capacitor that inject crosstalk having a first polarity between the first and second differential pairs at different points in time. A first compensating stage is provided in the plug-jack connector between the first differential pair and the second differential pair, where the first compensating crosstalk stage includes at least a third capacitor and a separate fourth capacitor that inject crosstalk having a second polarity that is opposite the first polarity between the first and second differential pairs at different points in time.

Pursuant to still further embodiments of the present invention, communications connectors are provided that include a plurality of input ports, a plurality of output ports, a plurality of differential pairs of conductive paths that extend between respective pairs of the input ports and respective pairs of the output ports, and a crosstalk injection circuit that injects crosstalk between first and second of the differential pairs of conductive paths. The crosstalk injection circuit includes at least first, second and third discrete crosstalk injection elements that are time-delayed with respect to each other.

In some embodiments, the phase shift that a signal experiences in passing from the location of the first crosstalk injection circuit to the location of the third crosstalk injection circuit may be at least eighteen degrees. The crosstalk injection circuit may further include a fourth discrete crosstalk injection element that is delayed with respect to the first, second and third discrete crosstalk injection elements. The first, second and third discrete crosstalk injection elements may all be between a first conductive path of the first of the differential pairs of conductive paths and a first conductive path of the second of the differential pairs of conductive paths. The first, second and third discrete crosstalk injection elements may all be capacitive crosstalk injection elements. The crosstalk injection circuit may further include a fourth discrete crosstalk injection element that is time-delayed with respect to the first, second and third discrete crosstalk injection elements. At least one of the first, second and third discrete crosstalk injection elements may comprise an inductive crosstalk injection element in some embodiments.

DETAILED DESCRIPTION

Pursuant to embodiments of the present invention, communications connectors are provided that use a plurality of "discrete" elements to implement the capacitive and/or inductive components of offending crosstalk stages and/or compensatory crosstalk stages. As discussed above, communications plugs routinely include offending crosstalk stages that are provided between the differential pairs of the plug, and communications jacks routinely include one or more compensating crosstalk stages that are provided between the differential pairs of the jack. Typically, these crosstalk stages are implemented as a single element such as a capacitor or an inductive coupling section that couple signal energy between two conductive paths or as the combination of a single inductive element and a single capacitive element that couple signal energy between two conductive paths. It has been discovered, however, that for connectors that carry very high frequency signals, improved return loss and insertion loss performance may be achieved if the inductive and/or capacitive components that form a crosstalk stage are broken down into a plurality of "discrete" elements that are time-delayed with respect to each other. The use of a plurality of inductive or capacitive elements to form a discrete crosstalk stage may have little impact on crosstalk compensation performance (and modeling indicates it may actually improve FEXT performance), but may substantially improve return loss and insertion loss performance at higher frequencies. Moreover, at lower frequencies, the use of a plurality of inductive or capacitive elements to form a discrete crosstalk stage can produce the desired amount of crosstalk in the plug and jack that may be required by various industry standards. Thus, the techniques according to embodiments of the present invention are backwards compatible with the installed base of plugs and jacks such that the plugs and jacks according to embodiments of the present invention may be fully functional when used in communications channels that include older plugs, jacks and cabling.

RJ-45 type communication connectors (e.g., plugs and jacks) must be designed to control the insertion loss and return loss in order to be suitable for very high frequency application such as applications at frequencies above 1 GHz. For RJ-45 connectors that carry very high frequency signals, improved return loss and insertion loss performance may be achieved if the inductive and/or capacitive components that form a crosstalk stage are broken down into a plurality of "discrete" elements that are time-delayed with respect to each other. The crosstalk injection stage (i.e., the offending crosstalk), and/or the compensating crosstalk stages in a communications connector may be implemented using a plurality of discrete, time-delayed elements according to embodiments of the present invention in order to provide improved return loss and/or insertion loss performance.

Figure 1:
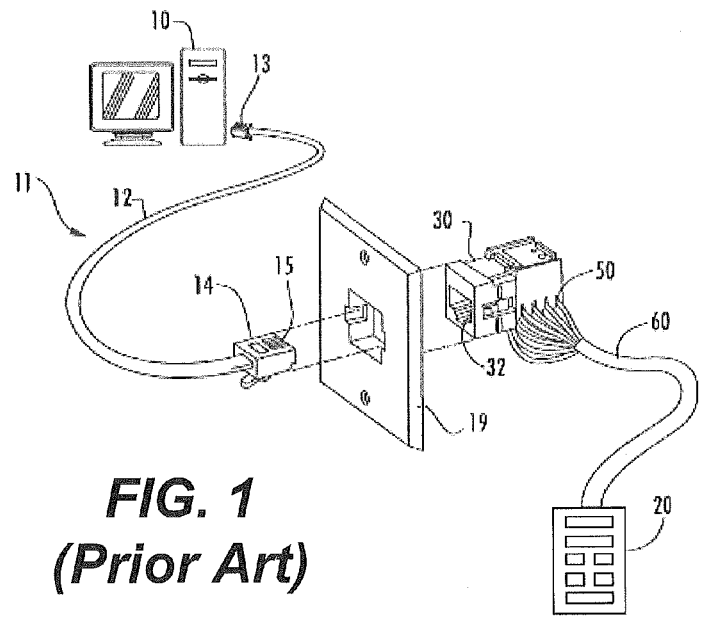
FIG. 1 is a schematic drawing that illustrates the use of communications plug-jack connectors to connect a computer to network equipment.
Figure 2:
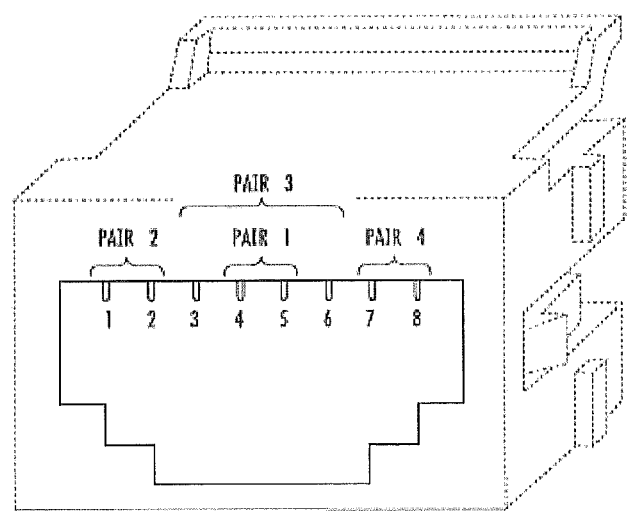
FIG. 2 is a schematic diagram illustrating the modular jack contact wiring assignments for a conventional 8-position communications jack (TIA 568B) as viewed from the front opening of the jack.
Figure 3:
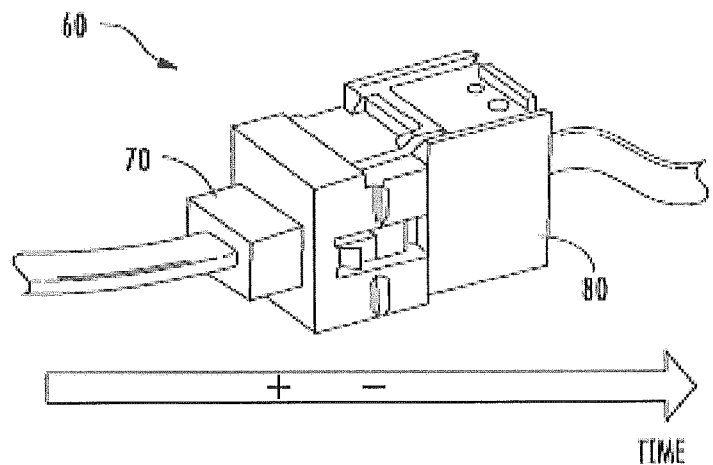
FIG. 3 is a schematic diagram of a prior art communications plug that is mated with a prior art communications jack that introduces a compensating crosstalk signal in the jack.
Figure 4:
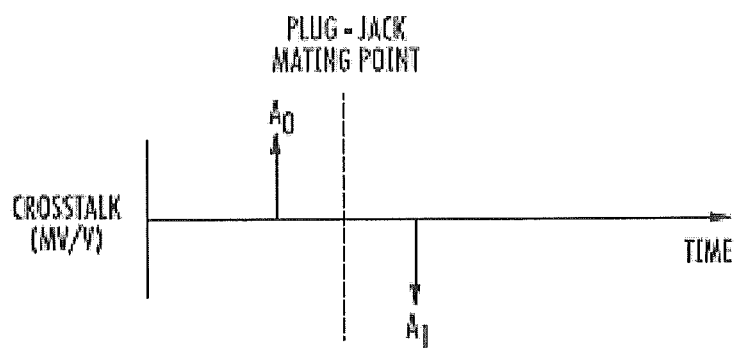
FIG. 4 is a schematic graph of crosstalk versus time that illustrates the location of the offending and compensating crosstalk (depicted as lumped approximations) in the plug-jack connector of FIG. 3.
Figure 5A:
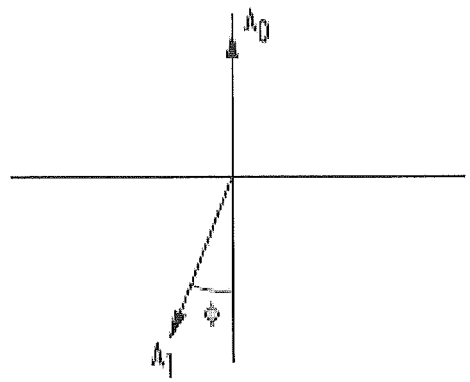
FIG. 5A is a vector diagram that illustrates certain of the crosstalk vectors in the plug-jack connector of FIG. 3 and how the delay between the vectors results in a phase shift.
Figure 5B:
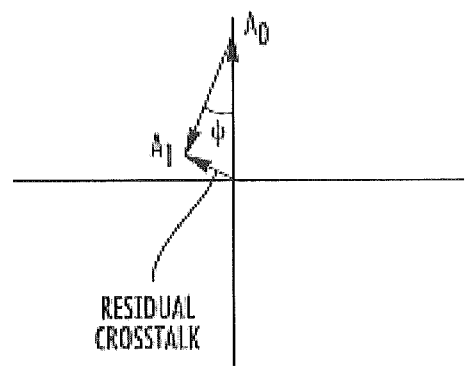
FIG. 5B is a vector summation diagram that illustrates how the vectors of FIG. 5A will not sum to zero for higher frequency signals due to the delay between vectors $A_0$ and $A_1$.
Figure 6A:
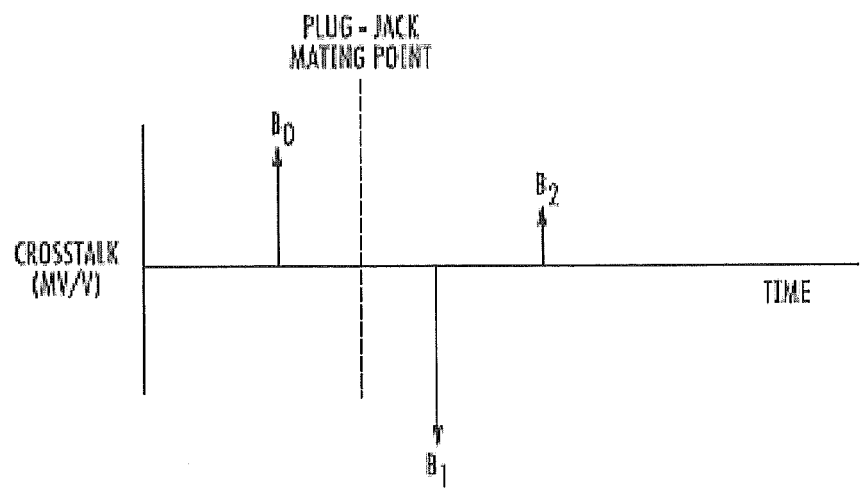
FIG. 6A is a schematic graph of crosstalk versus time that illustrates the location of the offending and compensating crosstalk (depicted as lumped approximations) in a plug-jack connector that implements multi-stage crosstalk compensation.
Figure 6B:
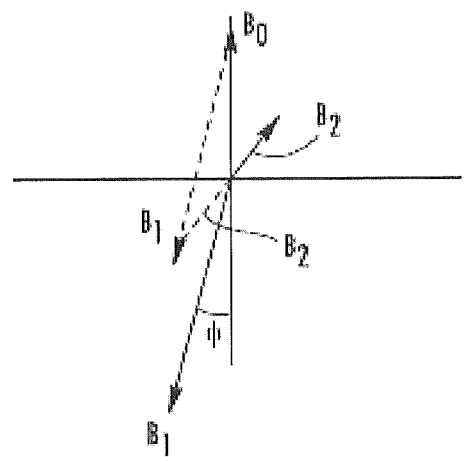
FIG. 6B is a vector summation diagram that illustrates how the multi-stage compensation crosstalk vectors $B_1$ and $B_2$ of FIG. 6A can cancel the offending crosstalk $B_0$ at a selected frequency.
Figure 7:
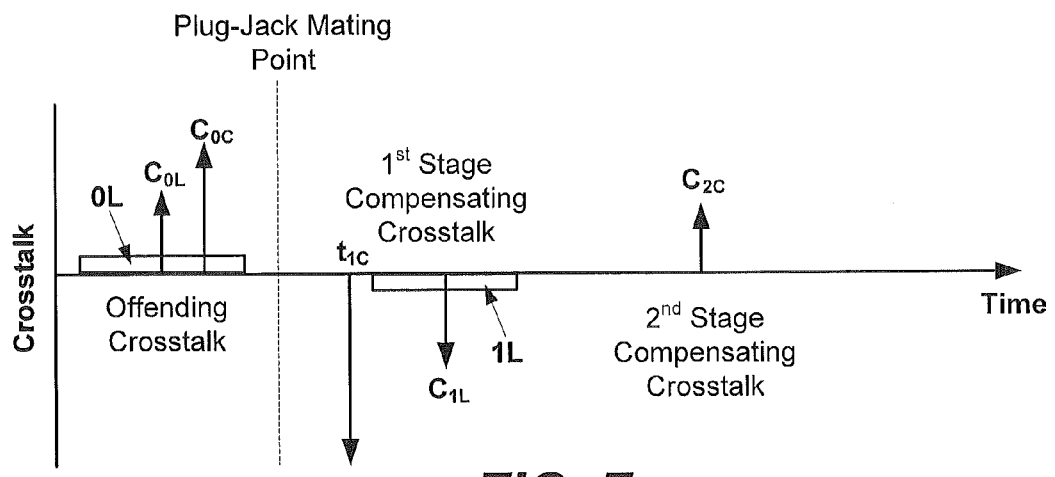
FIG. 7 is a schematic graph that illustrates the locations of the offending and compensating crosstalk in a typical conventional plug-jack connector.

FIG. 7 is a crosstalk timeline that illustrates the crosstalk signals that are injected between two differential pairs (e.g., pairs 1 and 3) in an exemplary prior art mated plug-jack connector. As shown in FIG. 7, an offending crosstalk signal is injected between the pairs that includes an inductive component $C_{OL}$ and a capacitive component $C_{OC}$. This offending crosstalk signal arises because of the capacitive coupling that occurs between conductors 3 and 4 (and likewise between conductors 5 and 6) in the regions where the plug blades and jackwire contacts for conductive paths 3 and 4 run adjacent to each other. Each crosstalk component is represented by a vector in FIG. 7 which indicates the magnitude of the crosstalk (shown by the height of the vector), the polarity of the crosstalk (shown by the up or down direction of the vector) and the relative locations in time where the coupling occurs (shown by the relative position of the vectors on the time-axis), assuming that the signal is travelling from the plug into the jack.

As shown in FIG. 7, the capacitive component of the offending crosstalk stage is typically modeled as a single lumped element capacitor represented by the vector $C_{OC}$ in FIG. 7 that injects crosstalk at a single point in time. It will be appreciated that in some cases at least some of the capacitive component may actually be distributed in time, but in order to simplify the discussion, herein each capacitive coupling is represented by the single vector $C_{OC}$, where the magnitude of vector $C_{OC}$ is equal to the sum of the distributed capacitive coupling (if distributed) and the vector $C_{OC}$ is located at a point along the time axis that corresponds to the magnitude-weighted center-point of the distributed capacitive coupling. The inductive component of the offending crosstalk will be distributed over time. The continuous nature of the inductive component is illustrated in FIG. 7 by the rectangular box labeled "0L." However, as shown in FIG. 7, in order to simplify the crosstalk analysis, the inductive component of the offending crosstalk may be represented by a vector $C_{OL}$ that has a magnitude that is equal to the sum of the distributed coupling and that is located on the time axis at the magnitude-weighted center-point of the inductive coupling region. As shown in FIG. 7, typically the offending capacitive crosstalk vector $C_{OC}$ will be located to the right of the offending inductive crosstalk vector $C_{OL}$ as the capacitive coupling occurs primarily the plug blades, while the inductive coupling occurs both between the conductive wires once they are untwisted in the plug as well as in the plug blades. The dotted vertical line in FIG. 7 indicates the plug-jack mating point (i.e., the location on the time axis where the leading edge of a signal transmitted through the plug reaches the contacts of the jack). It should be noted that FIG. 7 is a schematic graph (as are the similar graphs that follow) that is not necessarily intended to show the exact magnitudes of the crosstalk vectors and/or exact time delays between these vectors.

As is also shown in FIG. 7, a first stage of compensating crosstalk is injected between differential pairs 1 and 3 in the jack. Most typically, this first stage of compensating crosstalk includes an inductive crosstalk component which may be generated, for example, by using a crossover to reverse the positions of two of the jackwire contacts (e.g., the jackwire contacts for conductive paths 4 and 5), as well as a capacitive crosstalk component which may be generated, for example, by positioning a capacitor between conductive paths 3 and 5 (or 4 and 6) on a printed circuit board of the jack. The crosstalk injected by the inductive crosstalk component is a continuous crosstalk signal as shown by the rectangle labeled "1L" in FIG. 7. In order to simplify the analysis, the inductive crosstalk 1L is typically represented by a single vector $C_{1L}$ that is located at the weighted mid-point of where this inductive compensating crosstalk is injected. The crosstalk injected by the capacitive crosstalk component is represented by the vector $C_{1C}$ in FIG. 7, which is located along the timeline at the point where the lumped-element capacitor that is used to provide that is capacitive crosstalk is positioned between the pairs. As shown in FIG. 7, the polarity of both the inductive component $C_{1L}$ and the capacitive component $C_{1C}$ of the compensating crosstalk is opposite the polarity of the offending crosstalk vectors $C_{OL}$ and $C_{OC}$.

Finally, another capacitor may be provided on the printed circuit board of the jack that injects a second stage of compensating crosstalk. This stage of compensating crosstalk is represented by the vector labeled $C_{2C}$ in FIG. 7. The polarity of crosstalk $C_{2C}$ is the same as the polarity of crosstalk vectors $C_{OC}$ and $C_{OL}$.

As shown in FIG. 7, in conventional plug-jack connectors, the capacitive component of each crosstalk stage is typically implemented using a single lumped element that injects all of the crosstalk at a single location (e.g., the capacitor represented by crosstalk vector $C_{2C}$), and the inductive component (if any) of each crosstalk stage is typically implemented as a single continuous coupling section. Implementing the crosstalk stages in this manner, however, gives rise to large discontinuities in the signals that are transmitted through the connector.

Pursuant to embodiments of the present invention, a different approach may be used where the capacitive and/or inductive components of one or more of the crosstalk stages are implemented using at least two discrete components that inject crosstalk at different times instead of as a single component. Pursuant to this technique, the capacitive and/or inductive components of the crosstalk stage are implemented as a plurality of smaller coupling sections instead of one large section, where the smaller coupling sections are time-delayed with respect to each other. By way of example, pursuant to embodiments of the present invention, the capacitor represented by crosstalk vector $C_{2C}$ in the example of FIG. 7 may be replaced with two, three, four or more smaller capacitors, that are time-delayed with respect to each other. Alternatively or additionally, the capacitor represented by crosstalk vector $C_{1C}$ in the example of FIG. 7 may be replaced with two, three, four or more smaller capacitors, that are time-delayed with respect to each other. Likewise, the inductive coupling represented by crosstalk vector $C_{1L}$ in the example of FIG. 7 may be replaced with two, three, four or more smaller inductive coupling sections, where the inductive coupling sections are both time-delayed with respect to each other and separated by sections where coupling did not occur between the conductors at issue. It has been discovered by using a plurality of discrete, time-delayed capacitors or inductive coupling sections to implement a crosstalk stage, the plugs, jacks and mated plug-jack combinations according to embodiments of the present invention may exhibit improved performance, particularly at higher frequencies.

Figure 8:
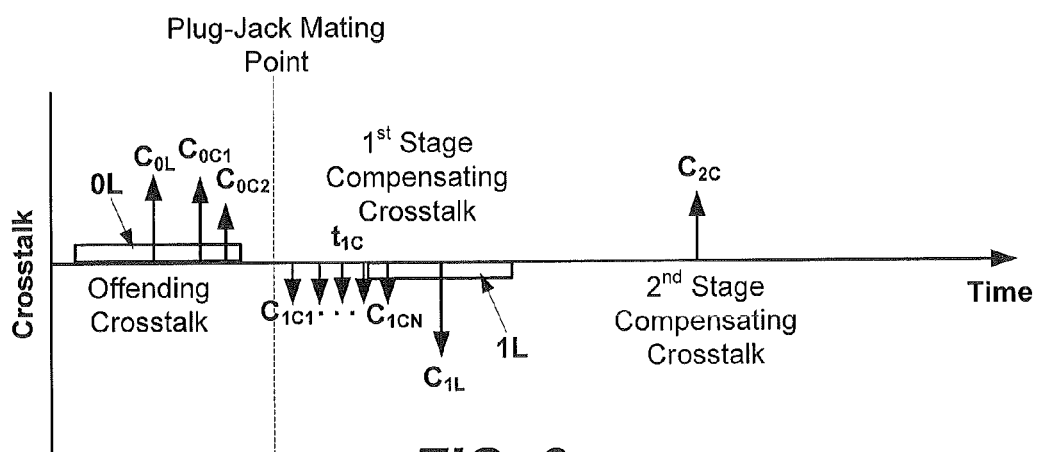
FIG. 8 is a crosstalk timeline that illustrates how a single lumped-element capacitive or inductive component of a crosstalk stage may be replaced with a plurality of smaller, discrete capacitive or inductive components pursuant to embodiments of the present invention.

FIG. 8 is a crosstalk timeline that illustrates how various of the single lumped element capacitive or inductive crosstalk components of FIG. 7 may be replaced with a plurality of smaller, discrete elements. In particular, as shown in FIG. 8, the capacitive component $C_{OC}$ of the offending crosstalk stage in FIG. 7 has been replaced with two smaller capacitive crosstalk components that are labeled crosstalk vectors $C_{OC1}$ and $C_{OC2}$ in FIG. 8. Likewise, the capacitive component $C_{1C}$ of the first compensating crosstalk stage in FIG. 7 has been replaced with a plurality of smaller crosstalk vectors $C_{1C1}$ through $C_{1CN}$. The crosstalk vectors $C_{OC1}$ and $C_{OC2}$ may, for example, have a combined magnitude that is equal to the magnitude of vector $C_{OC}$ in FIG. 7, and may have a weighted center-point that is at the location of vector $C_{OC}$ in FIG. 7. Likewise, the crosstalk vectors $C_{1C1}$ through $C_{1CN}$ may comprise a plurality of discrete vectors (i.e., they are time-delayed with respect to each other, and are separated by time periods where no crosstalk is injected), and these vectors may be injected at times both before and after the time $t_{1C}$ at which crosstalk vector $C_{1C}$ is injected in FIG. 7. In some embodiments, the sum of the magnitudes of $C_{1C1}+C_{1C2}+C_{1C3}+\ldots C_{1CN}$ may be equal to the magnitude of $C_{1C}$, and the weighted center-point of the vectors $C_{1C1}+C_{1C2}+C_{1C3}+\ldots C_{1CN}$ may be located at time $t_{1C}$. While in FIG. 8 each of the crosstalk vectors $C_{1C1}+C_{1C2}+C_{1C3}+\ldots C_{1CN}$ appear to have the same magnitude, it will be appreciated that the vectors $C_{1C1}+C_{1C2}+C_{1C3}+\ldots C_{1CN}$ may or may not have the same magnitude. It will likewise be appreciated that the time delays between the vectors $C_{1C1}+C_{1C2}+C_{1C3}+\ldots C_{1CN}$ may or may not be equal.

Figure 9:
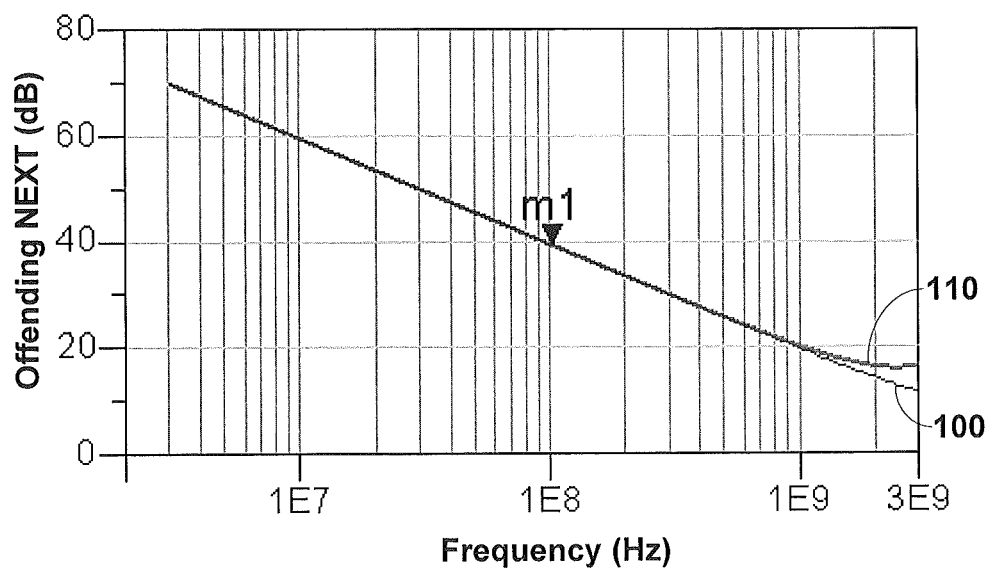
FIG. 9 is a graph illustrating the modeled near-end crosstalk performance of a conventional plug as compared to a plug that implements the crosstalk discretization techniques according to embodiments of the present invention.

FIG. 9 is a graph illustrating the modeled near-end crosstalk that is generated in a conventional plug as compared to a plug that implements the crosstalk discretization techniques according to embodiments of the present invention.

In particular, plot 100 in FIG. 9 illustrates the modeled near end crosstalk that is injected from a first differential pair of a conventional, industry-standards compliant RJ-45 communications plug to a second differential pair of the communications plug. The model of the communications plug that was used to generate curve 100 assumed that all of the crosstalk between the first and second differential pairs was capacitive crosstalk that was injected as a single lumped element. Plot 110 in FIG. 9 illustrates the modeled near end crosstalk that is injected from a first differential pair of an industry-standards compliant RJ-45 communications plug to a second differential pair of the communications plug. The model of the communications plug that was used to generate curve 110 assumed that the offending crosstalk was injected using three pairs of smaller capacitors that were time-delayed with respect to each other, where the sum of the magnitudes of the three pairs of smaller capacitors was equal to the magnitude of the single capacitor included in the model of the communications plug used to generate curve 100. As shown in FIG. 9, for all frequencies less than 1 GHz, the near end crosstalk generated by the two plugs that were modeled are indistinguishable, with near end crosstalk in each case increasing with increasing frequency at a rate of 20 dB per decade. Thus, FIG. 9 illustrates that at the frequencies of interest it is not anticipated that implementing a crosstalk stage using a plurality of discrete, time-delayed components will negatively impact the near end crosstalk performance of the connector as compared to using a conventional lumped element to implement the crosstalk stage.

It has been discovered that implementing crosstalk stages using a plurality of discrete, time-delayed elements can provide improved return loss and insertion loss performance at higher frequencies. The results of several computer models of return loss and insertion loss performance will now be discussed that illustrate this improved performance.

Figure 10A:
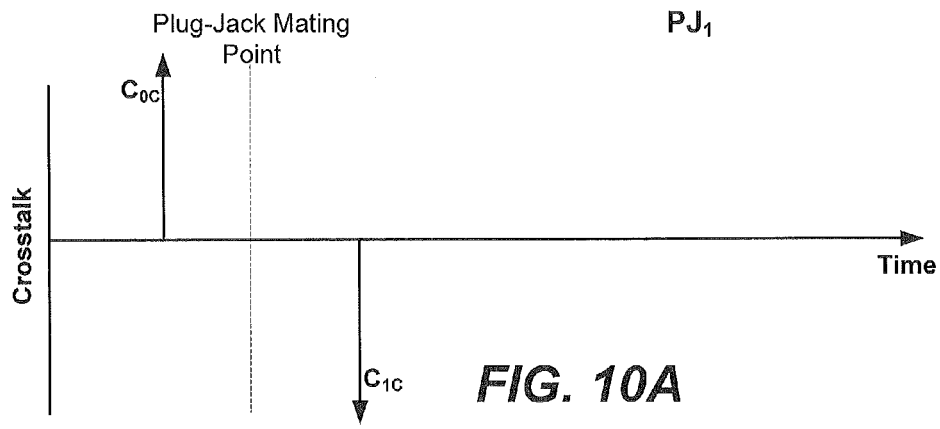
FIG. 10A is a crosstalk timeline that illustrates a conventional single-stage crosstalk compensation scheme for a mated plug-jack connector.
Figure 10B:
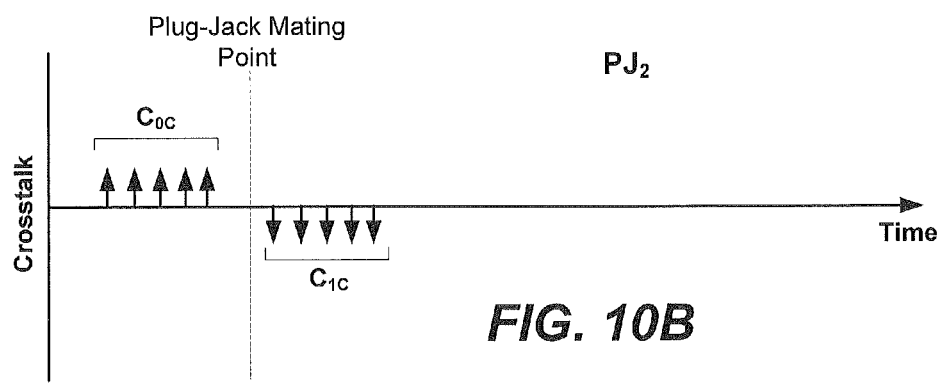
FIG. 10B is a crosstalk timeline that illustrates an example single-stage crosstalk compensation scheme for a mated plug-jack connector according to embodiments of the present invention.
Figure 11A:
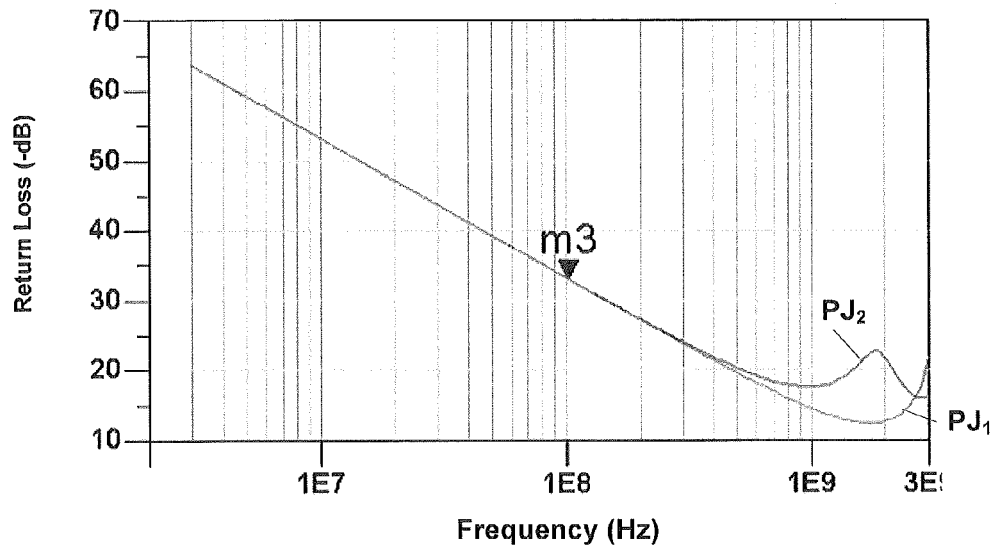
FIG. 11A is a graph illustrating the modeled return loss performance of the plug-jack connectors of FIGS. 10A and 10B.
Figure 11B:
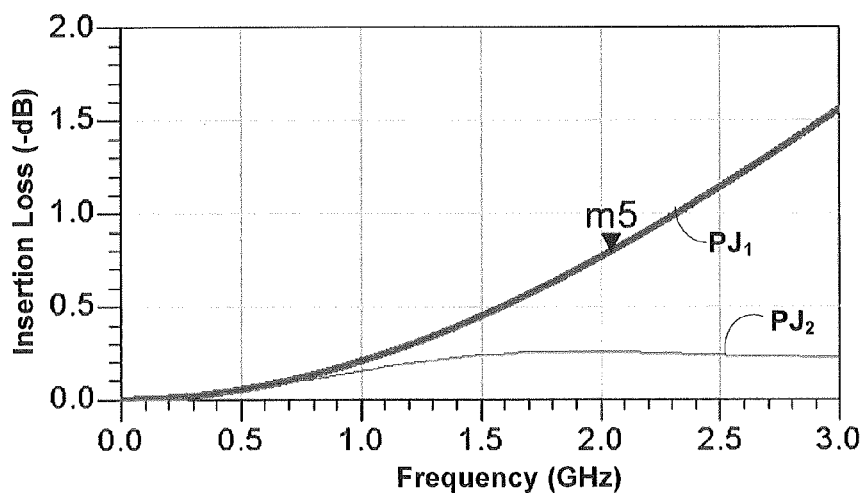
FIG. 11B is a graph illustrating the modeled insertion loss performance of the plug-jack connectors of FIGS. 10A and 10B.

In particular, FIGS. 10A and 10B are crosstalk timelines that graphically illustrate two example crosstalk compensation schemes between two of the differential pairs in a mated plug-jack connector. FIGS. 11A and 11B are graphs that illustrate the modeled return loss and insertion loss performance, respectively, of plugs and jacks that implement the crosstalk compensation schemes shown in FIGS. 10A-10B.

As shown in FIG. 10A, the first crosstalk compensation scheme that was modeled was a mated plug-jack combination $PJ_1$ that introduced an offending crosstalk signal $C_{OC}$ in the plug and a compensating crosstalk signal $C_{1C}$ in the jack that was injected via a single, lumped element capacitor. The compensating crosstalk signal $C_{1C}$ has the same magnitude, but was time delayed with respect to the offending crosstalk signal $C_{OC}$ (i.e., plug-jack combination $PJ_1$ uses a conventional, single stage crosstalk compensation scheme). As shown in FIG. 10B, the second crosstalk compensation scheme that was modeled was a mated plug-jack combination $PJ_2$ that is identical to the first crosstalk compensation scheme $PJ_1$, except that in the mated plug-jack combination $PJ_2$ the offending crosstalk $C_{OC}$ was injected using a series of five smaller discrete capacitors that were time-delayed with respect to each other and the compensating crosstalk $C_{1C}$ was similarly implemented via a series of five smaller discrete capacitors that were time-delayed with respect to each other. Thus, in $PJ_2$ the lumped element crosstalk vectors of plug-jack combination $PJ_1$ were replaced with two series of discrete crosstalk vectors.

FIG. 11A is a graph that compares the return loss performance of mated plug-jack connectors that implement the crosstalk compensation schemes of FIGS. 10A and 10B (i.e., the graph illustrates the modeled return loss performance of mated plug-jack combination $PJ_1$ and $PJ_2$). As shown in FIG. 11A, the return loss performance of the plug-jack combinations $PJ_1$ and $PJ_2$ was essentially identical for all frequencies below 400 MHz, while for frequencies and between 400 MHz and 2.5 GHz plug-jack combination $PJ_2$ demonstrated better return loss performance (with the improvement in some frequency ranges being as much as 10 dB). As return loss performance may, in some embodiments, be more difficult to meet at higher frequencies, the use of the discretization techniques according to embodiments of the present invention may provide significant improvement in return loss performance.

FIG. 11B is a graph that compares the insertion loss performance of mated plug-jack connectors that implement the crosstalk compensation schemes of FIGS. 10A and 10B (i.e., the graph illustrates the modeled insertion loss performance of mated plug-jack combination $PJ_1$ and $PJ_2$). As shown in FIG. 11B, the insertion loss performance of the plug-jack combinations $PJ_1$ and $PJ_2$ was essentially identical for all frequencies below 750 MHz, while for frequencies and between 750 MHz and 3.0 GHz plug-jack combination $PJ_2$ demonstrated improved insertion loss performance with increasing frequency, with an improvement of about 1.2 dB at 3.0 GHz.

Figure 12A:
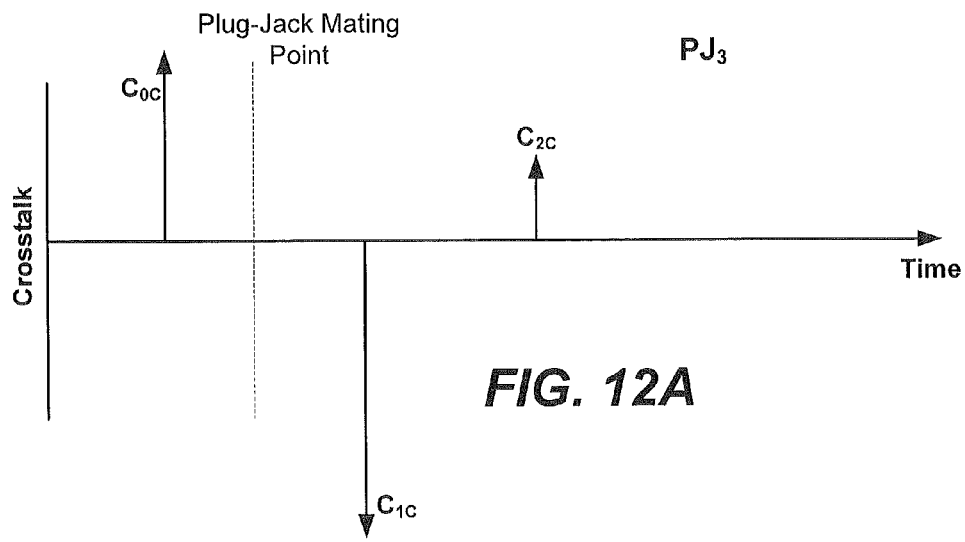
FIG. 12A is a crosstalk timeline that illustrates a conventional multi-stage crosstalk compensation scheme for a mated plug jack connector.
Figure 12B:
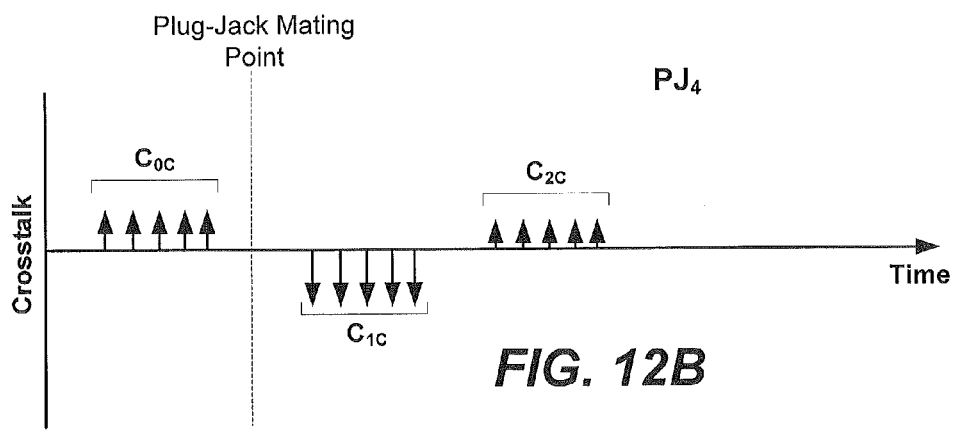
FIG. 12B is a crosstalk timeline that illustrates an example multi-stage crosstalk compensation scheme for a mated plug-jack connector according to embodiments of the present invention.
Figure 13A:
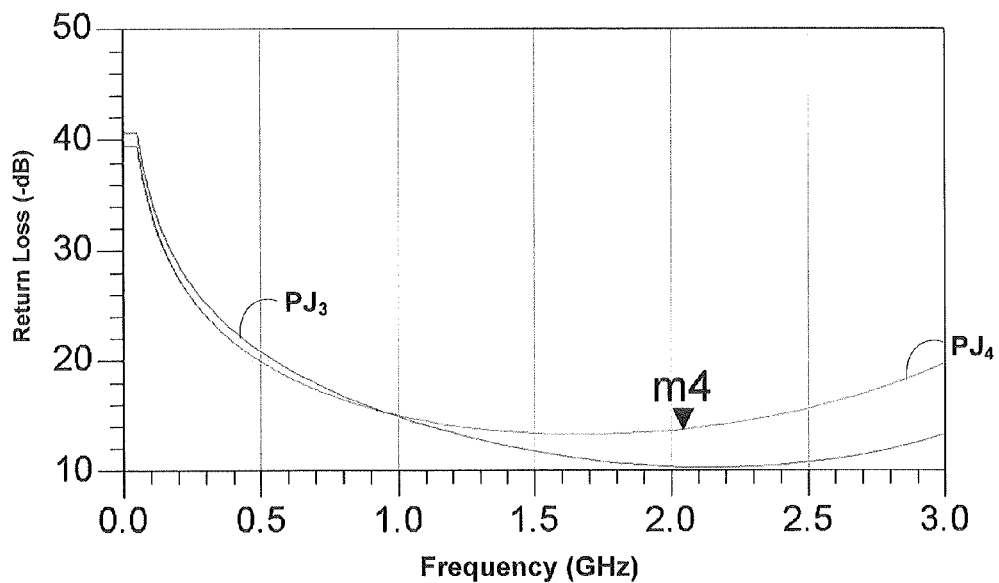
FIG. 13A is a graph illustrating the modeled return loss performance of the plug-jack connectors of FIGS. 12A and 12B.
Figure 13B:
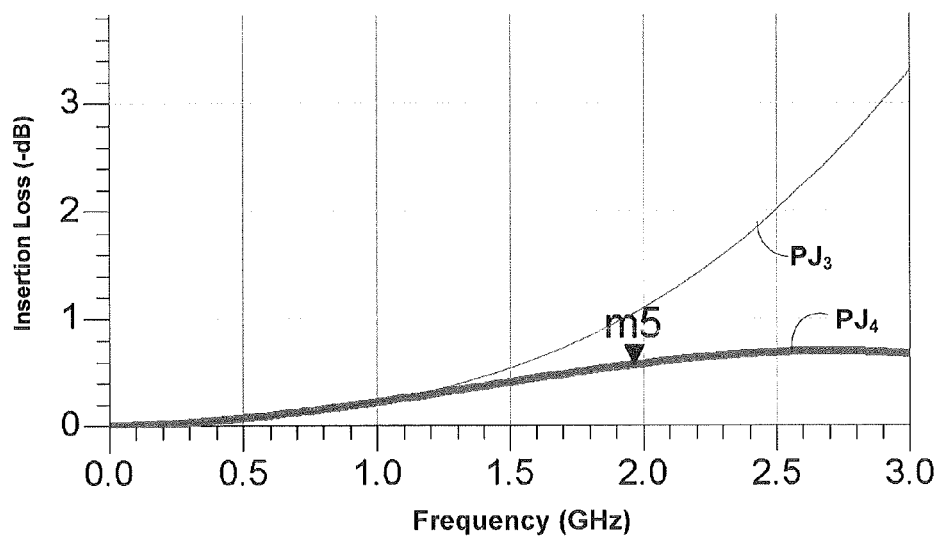
FIG. 13B is a graph illustrating the modeled insertion loss performance of the plug-jack connectors of FIGS. 12A and 12B.

FIGS. 12A and 12B are crosstalk timelines that graphically illustrate two additional example crosstalk compensation schemes between two of the differential pairs in a mated plug-jack connector. FIGS. 13A and 13B are graphs that illustrate the modeled return loss and insertion loss performance, respectively, of plugs and jacks that implement the crosstalk compensation schemes shown in FIGS. 12A-12B.

In particular, FIG. 12A illustrates a third crosstalk compensation scheme that was modeled as a mated plug-jack combination $PJ_3$ that injected an offending crosstalk signal in the plug and multi-stage compensating crosstalk signals in the jack. In mated plug-jack combination $PJ_3$, a single, lumped element capacitor was used to inject the offending crosstalk signal $C_{OC}$, a single, lumped element capacitor was used to inject a first stage compensating crosstalk signal $C_{1C}$ that had twice the magnitude and the opposite polarity of the offending crosstalk signal, and a single, lumped element capacitor was used to inject a second stage compensating crosstalk signal $C_{2C}$ that had the same magnitude and polarity as the offending crosstalk signal. The first and second compensating crosstalk stages were time delayed with respect to the offending crosstalk vector. FIG. 12B illustrates a fourth crosstalk compensation scheme that was modeled as a mated plug-jack combination $PJ_4$. The crosstalk compensation scheme of FIG. 12B ($PJ_4$) is similar to the crosstalk compensation scheme of FIG. 12A ($PJ_3$), except that in the mated plug-jack combination $PJ_4$ the offending crosstalk signal $C_{OC}$, the first compensating crosstalk signal $C_{1C}$ and the second compensating crosstalk signals $C_{2C}$ were modeled using a series of five smaller discrete capacitors that were time-delayed with respect to each other.

FIG. 13A is a graph that compares the return loss performance of mated plug-jack connectors that implement the crosstalk compensation schemes of FIGS. 12A and 12B (i.e., the graph illustrates the modeled return loss performance of mated plug-jack combination $PJ_3$ and $PJ_4$). As shown in FIG. 13A, while the return loss performance of plug-jack combination $PJ_4$ is about 0.5 dB to 1.5 dB worse than the return loss performance of plug-jack combination $PJ_3$ for frequencies under about 750 MHz, at higher frequencies (e.g., frequencies between 1.5 GHz and 3.0 GHZ the return loss performance of plug-jack combination $PJ_4$ is better than plug-jack combination $PJ_3$ by 3 to 8 dB. As return loss performance may, in some embodiments, be more difficult to meet at higher frequencies, the use of the discretization techniques according to embodiments of the present invention may provide significant improvement in return loss performance.

Discretization may provide even more dramatic improvement in insertion loss at higher frequencies, without any change in insertion loss performance at lower frequencies. In particular, as shown in FIG. 13B, starting at about 1.3 GHz, the insertion loss performance for plug-jack combination $PJ_4$ starts to exceed the insertion loss performance for plug-jack combination $PJ_3$, and rises from about a 0.5 dB improvement in insertion loss performance at 2 GHz to about a 2.5 dB improvement at 3 GHz.

Figure 13C:
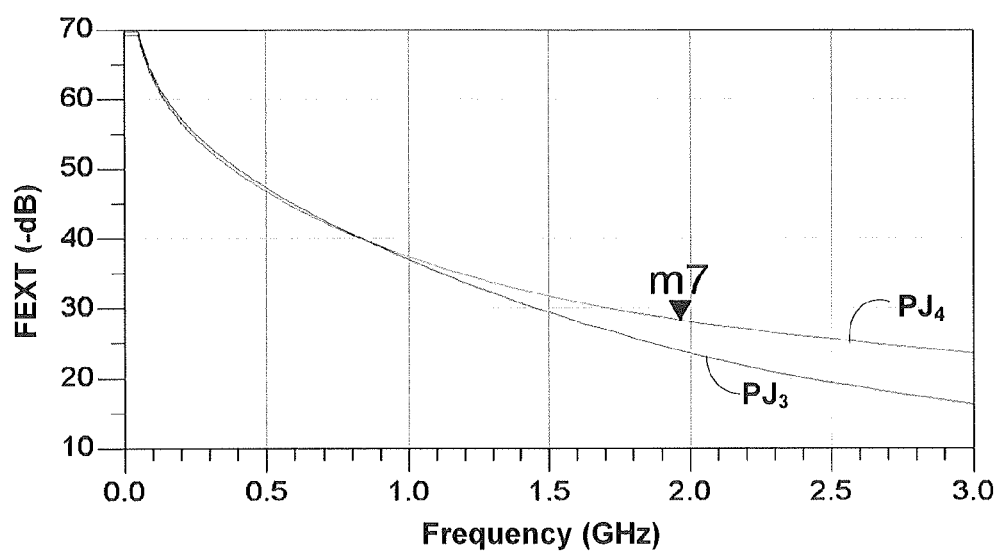
FIG. 13C is a graph illustrating the modeled far end crosstalk performance of a plug-jack connectors of FIGS. 12A and 12B.

Modeling results also suggest that implementing a crosstalk stage using a plurality of discrete, time-delayed components may also provide improved FEXT performance at higher frequencies. In particular, as shown in FIG. 13C, plug-jack combinations $PJ_3$ and $PJ_4$ demonstrate almost identical FEXT performance at frequencies up to 1.0 GHz, but at higher frequencies plug-jack combination $PJ_4$ starts to demonstrate improved FEXT performance, achieving about an 8 dB improvement in FEXT at 3.0 GHz.

Figure 14A:
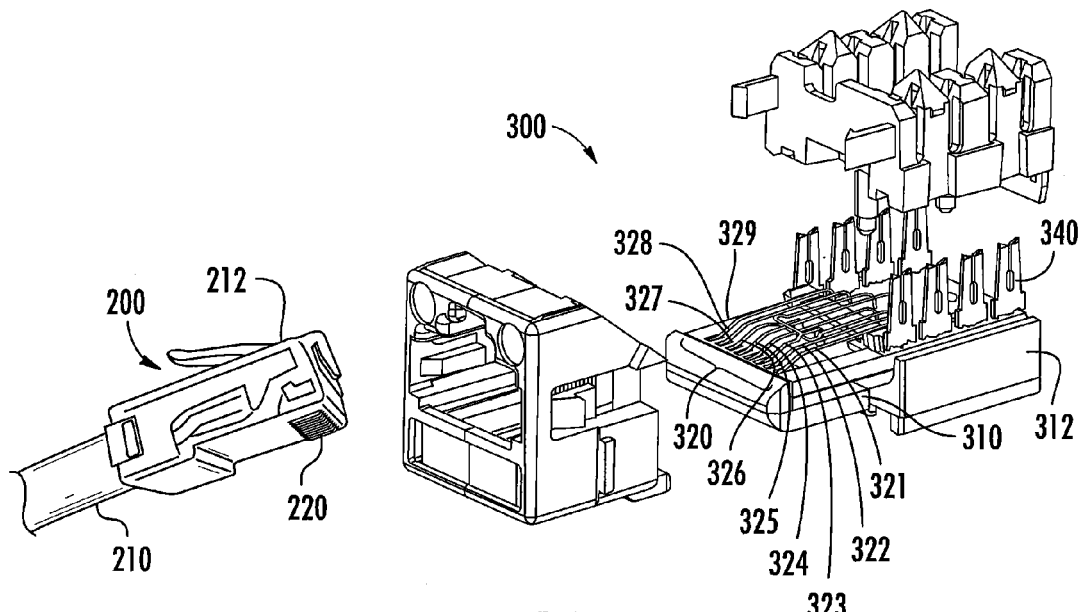
FIG. 14A is a perspective view of a communications plug and a communications jack according to embodiments of the present invention.

FIG. 14A is a perspective view of a communications plug 200 and a communications jack 300 that together form a mated plug-jack connector according to embodiments of the present invention. As shown in FIG. 14A, the plug 200 is attached to a cable 210 that has eight conductors (not visible in FIG. 14A). The cable 210 may be a conventional Ethernet cable such as, for example, a Category 6a compliant Ethernet cable. The plug 200 further includes eight plug blades 220 that are mounted in a housing 212. Each of the plug blades 220 is electrically connected to a respective one of the eight conductors of cable 210 to form eight communications paths 221-228 through the plug 200 (see FIG. 14B). These eight communications paths 221-228 are arranged as four differential pairs of communications paths 231-234 that may each carry a respective differential signal (see FIG. 14B). The plug 200 may include offending crosstalk stages between various of the communications paths 231-234. By way of example, crosstalk may be introduced in the plug 200 between differential communications path 231 and differential communications path 233. This crosstalk may include both inductive and capacitive components. In some embodiments, the amount of the crosstalk generated may be set to fall within a crosstalk range that is specified in an industry standard.

The jack 300 includes a housing 312 (which is a three piece housing in the depicted embodiment) and a plurality of jackwire contacts 320 that each have a fixed end that is mounted in a central portion of a printed circuit board 310 and a free distal end that is received under a mandrel adjacent the forward edge of the printed circuit board 310. Each jackwire contact 320 has a plug-jack mating point 329 where the jackwire contact 320 mates with a respective one of the plug blades 220. A plurality of IDC output terminals 340 are also included on the jack 300. Each of the IDC output terminals 340 is connected to a respective one of the jackwire contacts 320 via a respective conductive path (not shown) through the printed circuit board 310. Thus, a total of eight communications paths 321-328 may be provided through the jack 300. These eight communications paths 321-328 are arranged as four differential pairs of communications paths 331-334 that may each carry a respective differential signal. One or more compensating crosstalk stages may be provided in the jack 300 between various of the four differential pairs of communications paths 331-334. In the particular jack illustrated in FIG. 14A a multi-stage crosstalk compensation scheme is implemented in the jack 300, as shown in FIG. 14B.

Figure 14B:
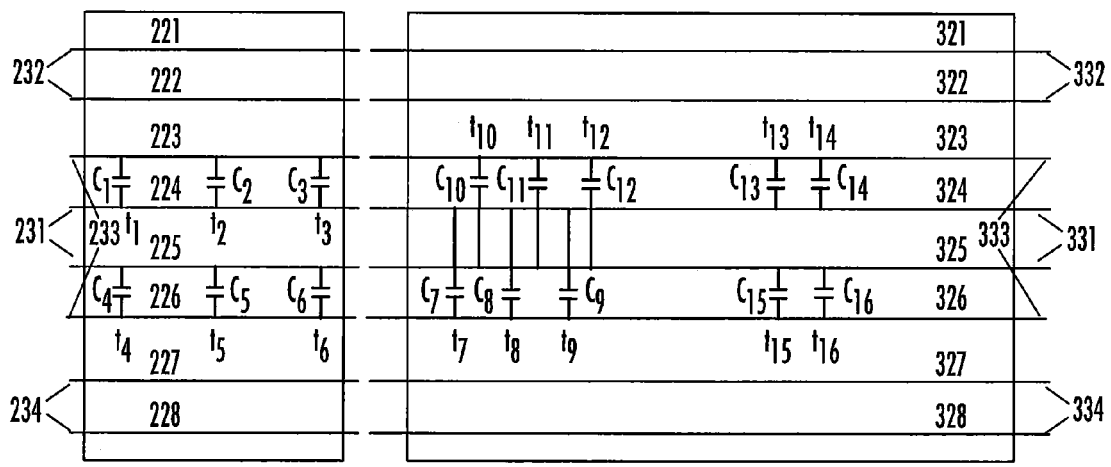
FIG. 14B is a schematic circuit diagram that illustrates how the discretization techniques according to embodiments of the present invention may be implemented between two of the differential pairs of the mated plug-jack connector of FIG. 14A.

FIG. 14B is a schematic circuit diagram of the mated plug-jack connector of FIG. 14A that illustrates how the crosstalk stages of a mated plug-jack combination (or of the individual plug and jack) may be implemented using a plurality of discrete, time-delayed elements according to embodiments of the present invention.

As shown in FIG. 14B, the eight communications paths 221-228 in the plug 200 are arranged so that communications paths 224 and 225 form the first differential pair of communications paths 231, communications paths 221 and 222 form the second differential pair of communications paths 232, communications paths 223 and 226 form the third differential pair of communications paths 233, and communications paths 227 and 228 form the fourth differential pair of communications paths 234. As is also shown in FIG. 14B, a total of six capacitive coupling sections are provided between differential pairs 231 and 233. In particular, a capacitor $C_1$ is provided between communications paths 223 and 224 at a location labeled $t_1$, a capacitor $C_2$ is provided between communications paths 223 and 224 at a location labeled $t_2$, and a capacitor $C_3$ is provided between communications paths 223 and 224 at a location labeled $t_3$. Locations $t_1$, $t_2$ and $t_3$ are time-delayed with respect to each other. Additionally, a capacitor $C_4$ is provided between communications paths 225 and 226 at a location labeled $t_4$, a capacitor $C_5$ is provided between communications paths 225 and 226 at a location labeled $t_5$, and a capacitor $C_6$ is provided between communications paths 225 and 226 at a location labeled $t_6$. Locations $t_4$, $t_5$ and $t_6$ are time-delayed with respect to each other. Locations $t_4$, $t_5$ and $t_6$ may or may not be time-delayed with respect to locations $t_1$, $t_2$ and $t_3$.

As is further shown in FIG. 14B, the eight communications paths 321-328 through the jack 300 are arranged so that communications paths 324 and 325 form the first differential pair of communications paths 331, communications paths 321 and 322 form the second differential pair of communications paths 332, communications paths 323 and 326 form the third differential pair of communications paths 333, and communications paths 327 and 328 form the fourth differential pair of communications paths 334. As is also shown in FIG. 14B, a total of six capacitive coupling sections are provided between differential pairs 331 and 333. In particular, a capacitor $C_7$ is provided between communications paths 324 and 326 at a location labeled $t_7$, a capacitor $C_8$ is provided between communications paths 324 and 326 at a location labeled $t_8$ and a capacitor $C_9$ is provided between communications paths 324 and 326 at a location labeled $t_9$. Locations $t_7$, $t_8$ and $t_9$ are time-delayed with respect to each other. Additionally, a capacitor $C_{10}$ is provided between communications paths 323 and 325 at a location labeled $t_{10}$, a capacitor $C_{11}$ is provided between communications paths 323 and 325 at a location labeled $t_{11}$ and a capacitor $C_{12}$ is provided between communications paths 323 and 325 at a location labeled $t_{12}$. Locations $t_{10}$, $t_{11}$ and $t_{12}$ are also time-delayed with respect to each other.

As is further shown in FIG. 14B, four additional capacitive coupling sections are provided between differential pairs 331 and 333 that form a second stage of crosstalk compensation. In particular, a capacitor $C_{13}$ is provided between communications paths 323 and 324 at a location labeled $t_{13}$, and a capacitor $C_{14}$ is provided between communications paths 323 and 324 at a location labeled $t_{14}$. Locations $t_{13}$ and $t_{14}$ are time-delayed with respect to each other. Additionally, a capacitor $C_{15}$ is provided between communications paths 325 and 326 at a location labeled $t_{15}$, and a capacitor $C_{16}$ is provided between communications paths 325 and 326 at a location labeled $t_{16}$. Locations $t_{15}$ and $t_{16}$ are also time-delayed with respect to each other.

According to embodiments of the present invention, one or more crosstalk stages that are implemented in a communications plug, jack or mated plug-jack connector may be broken into smaller discrete elements. In some embodiments, this may be done by breaking an inductive component of a crosstalk stage into at least two discrete components. In other embodiments, this may be done by breaking a capacitive component of a crosstalk stage into at least two discrete components. In still other embodiments, a crosstalk stage may include both inductive and capacitive components, one or both of which may be broken down into at least two discrete components. It will be appreciated that some crosstalk stages may only have inductive components or may only have capacitive components.

As shown in FIG. 14B, crosstalk having a specified polarity can be introduced between two differential pairs in two ways. For example, offending crosstalk can be injected by capacitively or inductively coupling energy between the first conductor of a first differential pair and a first conductor of a second differential pair (e.g., conductors 223 and 224 in FIG. 14B) and/or by capacitively or inductively coupling energy between the second conductor of the first differential pair and the first conductor of the second differential pair (e.g., conductors 225 and 226 in FIG. 14B). Thus, it will be appreciated that a capacitive or inductive component of a crosstalk stage may be implemented as a plurality of discrete, time-delayed components by implementing all of the discrete components between two specific conductive paths (e.g., conductive paths 223 and 224 in FIG. 14B) or by dividing the plurality of discrete components between the two pairs of conductive paths, as is shown in the example of FIG. 14B.

It will also be appreciated that one or more than one of the crosstalk stages in a mated plug-jack connector may be implemented to have inductive and/or capacitive components having more than two discrete elements. For example, in some embodiments, the inductive and/or capacitive components of the offending crosstalk stage could be implemented using a plurality of discrete, time-delayed elements. This would typically be done in the communications plug. In other embodiments, the inductive and/or capacitive components of a first compensating crosstalk stage could be implemented using a plurality of discrete, time-delayed elements. This would typically be done in the communications jack. In still other embodiments, the inductive and/or capacitive components of a second (or higher) compensating crosstalk stage could be implemented using a plurality of discrete, time-delayed elements. This would also typically be done in the communications jack. Any combination of these options may also be implemented.

Figure 15:
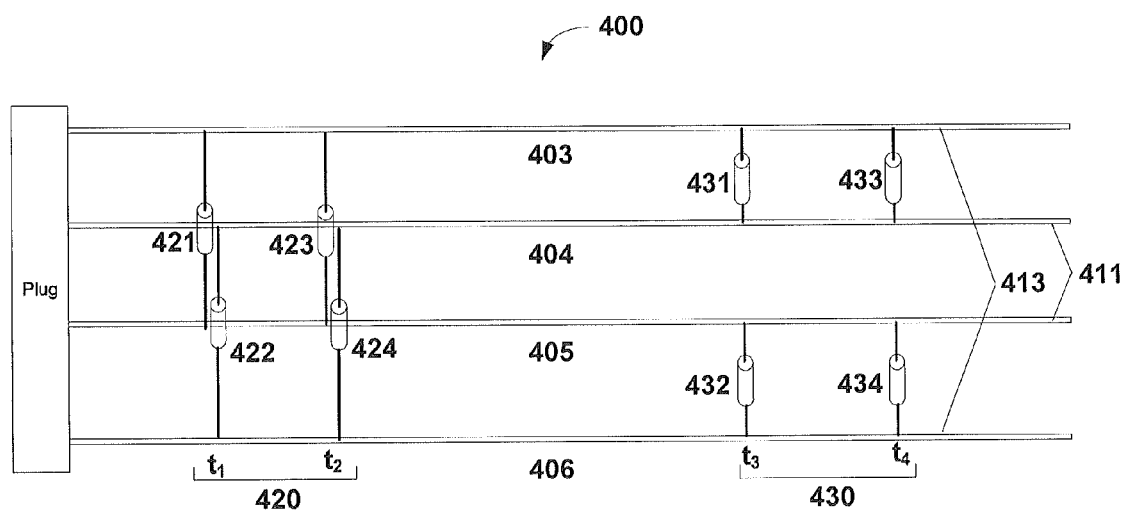
FIG. 15 is a block diagram that schematically illustrates how the compensating crosstalk stages in a communications jack may be implemented using a plurality of discrete, time-delayed elements according to further embodiments of the present invention.

FIG. 15 is a block diagram that schematically illustrates how the compensating crosstalk stages in a communications jack may be implemented using a plurality of discrete, time-delayed elements according to further embodiments of the present invention.

In particular, FIG. 15 schematically illustrates the first and second compensation stages 420, 430 of a two-stage crosstalk compensation circuit that is implemented between two pairs of conductive paths 411, 413 through a communications jack 400. As shown in FIG. 15, the first pair of conductive paths 411 includes conductive paths 404 and 405, and the second pair of conductive paths 413 includes conductive paths 403 and 406. The first pair of conductive paths 411 may, for example, correspond to the conductive paths of pair 1 of a TIA/EIA 568 type B RJ-45 jack, and the second pair of conductive paths 413 may, for example, correspond to the conductive paths of pair 3 of a TIA/EIA 568 type B RJ-45 jack. However, it will be appreciated that the conductive paths 403-406 could correspond to other pairs and/or that the jack 400 need not be an RJ-45 jack.

As shown in FIG. 15, the jack 400 is mated with a plug that introduces offending crosstalk between pairs 411 and 413. It will be appreciated that additional offending crosstalk is typically generated in the contacts (e.g., jackwire contacts of the jack 400) that may be considered to be part of the offending crosstalk stage. The first pair of conductive paths 411 comprises conductors 404 and 405 which run adjacent to each other on a printed circuit board of the jack 400. The second pair of conductive paths 413 comprises conductors 403 and 406 which straddle conductors 404 and 406 so that all four conductive paths 403-406 run in parallel to each other on the printed circuit board of the jack 400. It will be appreciated that typically the conductive paths would not be routed in parallel through the jack 400 as illustrated in FIG. 15, which uses such parallel paths as a simplified example.

The first compensation stage 420 of the crosstalk compensation circuit includes discrete components 421-424 that are used to provide compensating crosstalk in two time-delayed sub-stages. In particular, a first crosstalk compensation component 421 generates first stage compensating crosstalk (i.e., crosstalk having a polarity that is opposite the polarity of the offending crosstalk) between conductive paths 403 and 405, and a second crosstalk compensation component 422 generates first stage compensating crosstalk between conductive paths 404 and 406. As shown in FIG. 15, in this particular embodiment, the first crosstalk compensation component 421 and the second crosstalk compensation component 422 inject the compensating crosstalk signals at approximately the same point in time (time $t_1$). The first compensation stage 420 further include a third crosstalk compensation component 423 that generates first stage compensating crosstalk between conductive paths 403 and 405 and a fourth crosstalk compensation component 424 that generates first stage compensating crosstalk between conductive paths 404 and 406. The third and fourth crosstalk compensation components 423, 424 inject the compensating crosstalk signals at approximately the same point in time ($t_2$), where $t_2$ is a point in time after $t_1$. The first stage compensating crosstalk thus is implemented to inject crosstalk at two discrete, time-delayed locations.

The second compensation stage 430 of the crosstalk compensation circuit includes discrete components 431-434 that are also used to provide compensating crosstalk in two time-delayed sub-stages. In particular, a fifth crosstalk compensation component 431 generates second stage compensating crosstalk (i.e., crosstalk having a polarity that is the same polarity as the offending crosstalk) between conductive paths 403 and 404, and a sixth crosstalk compensation component 432 generates second stage compensating crosstalk between conductive paths 405 and 406. As shown in FIG. 15, in this particular embodiment, the fifth crosstalk compensation component 431 and the sixth crosstalk compensation component 432 inject the compensating crosstalk signals at approximately the same point in time (time $t_3$). The second compensation stage 430 further include a seventh crosstalk compensation component 433 that generates second stage compensating crosstalk between conductive paths 403 and 404 and an eighth crosstalk compensation component 434 that generates second stage compensating crosstalk between conductive paths 405 and 406. The seventh and eighth crosstalk compensation components 433, 434 inject the compensating crosstalk signals at approximately the same point in time ($t_4$), where $t_4$ is a point in time after $t_3$.

Each of the discrete crosstalk compensation components 421-424 and 431-434 represent a combination of resistors and/or capacitors and/or inductors that are selected to provide compensating crosstalk, having a predetermined magnitude and phase at a given frequency, between the first pair of conductive paths 411 and the second pair of conductive paths 413. The second compensation stage 430 may also include a small additional amount of compensating crosstalk that is generated between the output terminals (not shown) of pairs 411 and 413 and/or between wires of a cable (not shown) that are attached to those output terminals.

Any appropriate time delays may be used. For example, the time delay $t_2-t_1$ (i.e., the time delay between the discrete crosstalk signals injected in the first compensating stage 420) may be the same as or different than the time delay $t_4-t_3$ (i.e., the time delay between the discrete crosstalk signals injected in the second compensating stage 430). Likewise, the time delay $t_3-t_2$ (i.e., the time delay between the first and second compensating stages 420, 430) may be the same as or different than the time delay $t_2-t_1$ and/or the time delay $t_4-t_3$.

The crosstalk compensation techniques disclosed herein may be implemented on any appropriate communications connectors. For example, it is common practice to implement a plurality of communications jacks on a single printed circuit board as is commonly done in, for example, patch panel implementations. Likewise, it will be appreciated that the communications jacks may have two differential pairs of communications paths, four differential pairs of communications paths, or any other number of differential pairs of communications paths. The above-described techniques may also be implemented in communications plugs as well as in other types of communications connectors. Thus, it will be appreciated that the above-described embodiments are exemplary in nature and are in no way limiting regarding the scope of the present invention, which is defined by the claims appended hereto.

As noted above, the plugs and jacks according to embodiments of the present invention may provide improved electrical performance at higher frequencies. Thus, in some embodiments, they may be implemented in plugs and jacks that are designed to operate at frequencies above 500 MHz. In other embodiments, the techniques according to embodiments of the present invention may be implemented in plugs and jacks that are designed to operate at frequencies above 1 GHz.

In some embodiments, the inductive or capacitive crosstalk for a particular stage may be substantially equally spread out between a plurality of discrete elements. In some embodiments, the number of elements may be at least three. In other embodiments, the number of elements may be at least four. In still other embodiments, the number of elements may be at least five. After a particular design for a plug, jack or mated plug-jack connector is selected, a number of design parameters may be adjusted to meet desired return loss and insertion loss performance specifications. These design parameters include the number of discrete elements used to form a crosstalk stage, the magnitude of the crosstalk associated with each discrete element, and the phase shift that a signal experiences in passing from the discrete locations where crosstalk is injected (the phase shift is a function of the time delay between these elements and the frequency of the signal). In some embodiments, the phase shift between the first discrete component in a crosstalk stage and the last discrete component in the same crosstalk stage may be at least eighteen (18) degrees. By providing a phase shift of at least 18 degrees between the first inductive or capacitive element in a crosstalk stage and the last inductive or capacitive element in the same crosstalk stage it may be possible to achieve significant improvements in return loss and/or insertion loss performance at higher frequencies.

The present invention is not limited to the embodiments that are described above and depicted in the drawings. Instead, the above embodiments are intended to fully and completely disclose the invention to those skilled in this art.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

The invention claimed is:

1. A communications plug, comprising:
a plug housing;
eight plug blades that are arranged as first through fourth differential pairs of plug blades that are configured to mate with the contacts of a mating communications jack;
a first differential pair of conductive paths within the plug housing that are electrically connected to the first differential pair of plug blades;

a second differential pair of conductive paths within the plug housing that are electrically connected to the second differential pair of plug blades;
a first capacitor that is configured to inject crosstalk having a first polarity from the first differential pair of conductive paths to the second differential pair of conductive paths;
a second capacitor that is separate from the first capacitor, the second capacitor configured to inject crosstalk having the first polarity from the first differential pair of conductive paths to the second differential pair of conductive paths, wherein the first and second capacitors are configured to inject crosstalk at respective first and second points in time onto the second differential pair, wherein the first and second points in time are different; and
a third capacitor that is separate from the first and second capacitors, the third capacitor configured to inject crosstalk having the first polarity from the first differential pair to the second differential pair, wherein the third capacitor is configured to inject crosstalk at a third point in time onto the second differential pair, wherein the third point in time is different than both the first and second points in time,
wherein the first capacitor, the second capacitor and the third capacitor are implemented separately from the plug blades.

2. The communications plug of claim 1, wherein the first capacitor, the second capacitor and the third capacitor each comprise a discrete capacitor that is implemented on a printed circuit board that is mounted within the plug housing.

3. The communications plug of claim 1, wherein the first, second and third capacitors are each coupled between a first conductive path of the first differential pair of conductive paths and a first conductive path of the second differential pair of conductive paths.

4. A mated communications plug and communications jack, comprising:
a communications plug comprising:
a plug housing;
a first differential pair of conductive paths within the plug housing;
a second differential pair of conductive paths within the plug housing;
a first capacitor that is configured to inject crosstalk having a first polarity from the first differential pair to the second differential pair;
a second capacitor that is separate from the first capacitor, the second capacitor configured to inject crosstalk having the first polarity from the first differential pair to the second differential pair, wherein the first and second capacitors are configured to inject crosstalk at respective first and second points in time onto a signal travelling on the second differential pair, wherein the first and second points in time are different; and
a communications jack comprising:
a third differential pair of conductive paths that is electrically connected to the first differential pair of conductive paths to form a first communications channel through the mated communications plug and jack;
a fourth differential pair of conductive paths that is electrically connected to the second differential pair of conductive paths to form a second communications channel through the mated communications plug and jack;
a third capacitor that is configured to inject crosstalk having a second polarity from the third differential pair to the fourth differential pair, the second polarity being opposite the first polarity; and
a fourth capacitor that is configured to inject crosstalk having the second polarity from the third differential pair to the fourth differential pair, wherein the third and fourth capacitors are configured to inject crosstalk at respective third and fourth points in time onto a signal travelling on the fourth differential pair, wherein the third and fourth points in time are different.

5. A mated plug jack connector, comprising:
a communications jack having a housing that includes a plug aperture and at least a first differential pair of conductive paths and a second differential pair of conductive paths;
a communications plug that is received within the plug aperture of the communications jack, the communications plug having a third differential pair of conductive paths that electrically connect to the first differential pair of conductive paths of the jack and a fourth differential pair of conductive paths that electrically connect to the second differential pair of conductive paths of the jack;
wherein the communications plug includes an offending crosstalk stage that injects crosstalk having a first polarity between the third differential pair of conductive paths and the fourth differential pair of conductive paths, the offending crosstalk stage including at least separate first and second capacitive components that are time-delayed with respect to each other, the first and second capacitive components comprising first and second capacitors that are implemented in a printed circuit board of the communications plug; and
wherein the communications jack includes a compensating crosstalk stage that injects crosstalk between the first differential pair of conductive paths and the second differential pair of conductive paths that includes at least separate third and fourth capacitive components that have the same polarity that are time-delayed with respect to each other.

6. The mated plug jack connector of claim 5, wherein the crosstalk injected by the compensating crosstalk stage has a second polarity that is opposite the first polarity.

7. The mated plug jack connector of claim 6, wherein the offending crosstalk stage includes a third capacitor that is implemented in the printed circuit board of the communications plug that is time-delayed with respect to the first and second capacitors.

8. The mated plug jack connector of claim 5, wherein the compensating crosstalk stage includes at least a first inductive component, the third and fourth capacitive components, and a fifth component that is time delayed with respect to both the first inductive component and the third and fourth capacitive components.

9. The mated plug-jack connector of claim 5, wherein the third and fourth capacitive components comprise a third capacitor and a fourth capacitor, respectively, that are implemented on a printed circuit board.

10. The mated plug-jack connector of claim 9, wherein the compensating crosstalk stage further includes a fifth capacitor on the printed circuit board that has the same polarity as the third and fourth capacitors, wherein the third, fourth and fifth capacitors are all coupled between the first conductive path of the first differential pair of conductive paths and the first conductive path of the second differential pair of conductive paths.

11. The communications plug of claim 5, wherein the first and second capacitors are each coupled between a first conductive path of the first differential pair of conductive paths and a first conductive path of the second differential pair of conductive paths.

12. The communications plug of claim 5, wherein the third and fourth capacitors are each coupled between a first conductive path of the first differential pair of conductive paths and a first conductive path of the second differential pair of conductive paths.

13. A communications connector, comprising:
a plurality of input ports;
a plurality of output ports;
a plurality of differential pairs of conductive paths that extend between respective pairs of the input ports and respective pairs of the output ports;
a crosstalk injection circuit that injects crosstalk between a first of the differential pairs of conductive paths and a second of the differential pairs of conductive paths, wherein the crosstalk injection circuit includes at least first, second and third discrete crosstalk injection elements that are time-delayed with respect to each other and that all inject crosstalk having the same polarity between the first and second differential pairs of conductive paths.

14. The communications connector of claim 13, wherein the phase shift that a signal experiences in passing from the location of the first crosstalk injection circuit to the location of the third crosstalk injection circuit is at least eighteen degrees.

15. The communications connector of claim 13, wherein the crosstalk injection circuit further includes a fourth discrete crosstalk injection element having the same polarity of the first, second and third discrete crosstalk injection elements that is time-delayed with respect to the first, second and third discrete crosstalk injection elements.

16. The communications connector of claim 13, wherein the first, second and third discrete crosstalk injection elements are all between a first conductive path of the first of the differential pairs of conductive paths and a first conductive path of the second of the differential pairs of conductive paths.

17. The communications connector of claim 16, wherein the first, second and third discrete crosstalk injection elements each comprise a printed circuit board implemented capacitor.

18. The communications connector of claim 13, wherein the first, second and third discrete crosstalk injection elements are all capacitive crosstalk injection elements.

19. The communications connector of claim 13, wherein at least one of the first, second and third discrete crosstalk injection elements comprises an inductive crosstalk injection element.

20. The communications connector of claim 13, further comprising a second crosstalk injection circuit that injects crosstalk between the first of the differential pairs of conductive paths and the second of the differential pairs of conductive paths, wherein the second injection circuit includes at least first, second and third discrete crosstalk injection elements that are time-delayed with respect to each other, and wherein the second crosstalk injection circuit injects crosstalk having a polarity that is opposite the polarity of the crosstalk injected by the first crosstalk injection circuit.

* * * * *

UNITED STATES PATENT AND TRADEMARK OFFICE
CERTIFICATE OF CORRECTION

PATENT NO.         : 9,093,791 B2                                   Page 1 of 1
APPLICATION NO.    : 14/057224
DATED              : July 28, 2015
INVENTOR(S)        : Liang It is certified that error appears in the above-identified patent and that said Letters Patent is hereby corrected as shown below:

<u>In the Specification</u>:
Column 3, Line 33: Please correct ""plug jack mating region"),"
                   to read -- "plug-jack mating region"), --

Column 9, Line 32: Please correct "plug jack"
                   to read -- plug-jack --

<u>In the Claims</u>:
Column 22, Claim 5, Line 11: Please correct "plug jack"
                             to read -- plug-jack --

Column 22, Claim 6, Line 40: Please correct "plug jack"
                             to read -- plug-jack --

Column 22, Claim 7, Line 43: Please correct "plug jack"
                             to read -- plug-jack --

Column 22, Claim 8, Line 48: Please correct "plug jack"
                             to read -- plug-jack --

Signed and Sealed this
Twenty-first Day of June, 2016

Michelle K. Lee
*Director of the United States Patent and Trademark Office*